United States Patent [19]
Tomoe

[11] Patent Number: 6,167,244
[45] Date of Patent: Dec. 26, 2000

[54] GAIN CONTROL METHOD AND RECEIVER

[75] Inventor: Naohito Tomoe, Tokyo, Japan

[73] Assignee: Mitsubishi Denki Kabushiki Kaisha, Tokyo, Japan

[21] Appl. No.: 09/043,467

[22] PCT Filed: Sep. 5, 1996

[86] PCT No.: PCT/JP96/02510

§ 371 Date: Mar. 20, 1998

§ 102(e) Date: Mar. 20, 1998

[87] PCT Pub. No.: WO98/10514

PCT Pub. Date: Dec. 3, 1998

[51] Int. Cl.[7] .................................................. H04B 1/06
[52] U.S. Cl. ................................ 455/234.1; 455/232.1; 455/234.2
[58] Field of Search ...................... 455/234.1, 232.1, 455/234.2, 235.1, 240.1, 245.1, 136, 233.1, 138, 246.1, 247.1, 248.1, 249.1, 251.1; 375/345

[56] References Cited

U.S. PATENT DOCUMENTS

| | | | |
|---|---|---|---|
| 4,709,406 | 11/1987 | Omoto | 455/208 |
| 5,040,194 | 8/1991 | Tjahjadi et al. | 375/98 |
| 5,184,349 | 2/1993 | Riordan | 370/95.3 |
| 5,301,364 | 4/1994 | Arens et al. | 455/69 |
| 5,452,332 | 9/1995 | Otani et al. | 375/345 |
| 5,659,582 | 8/1997 | Kojima et al. | 375/345 |

FOREIGN PATENT DOCUMENTS

| | | |
|---|---|---|
| 9006644 | 6/1990 | European Pat. Off. . |
| 9117606 | 11/1991 | European Pat. Off. . |
| 0496507 | 7/1992 | European Pat. Off. . |
| 0607944 | 7/1994 | European Pat. Off. . |
| 0674402 | 9/1995 | European Pat. Off. . |
| 58-194414 | 11/1983 | Japan . |
| 9213404 | 8/1992 | WIPO . |

*Primary Examiner*—Dwayne D. Bost
*Assistant Examiner*—Joy Redmon
*Attorney, Agent, or Firm*—Rothwell, Figg, Ernst & Manbeck

[57] ABSTRACT

In an AGC system, a high-speed convergence of an AGC is provided at a burst signal head for an aperiodic burst signal inherent in a base station, having irregular transmitting power from a mobile station, and transmitting power is controlled and a receive of an interference wave is detected for a periodic burst signal according to the presence or absence of voice at the mobile station, thereby preventing an erroneous control of the AGC and maintaining communication quality in a radio base station system. In case of the aperiodic burst signal, a receive level is detected at high speed by, in an attenuator and an AGC amplifier serving as a gain control device, setting the AGC amplifier with a slower transient response to a fixed gain, and turning ON/OFF only the attenuator with a rapid transient response. In case of the periodic burst signal, a synchronous word contained in the burst signal is used to prevent the erroneous control and detect interference in the AGC.

21 Claims, 14 Drawing Sheets

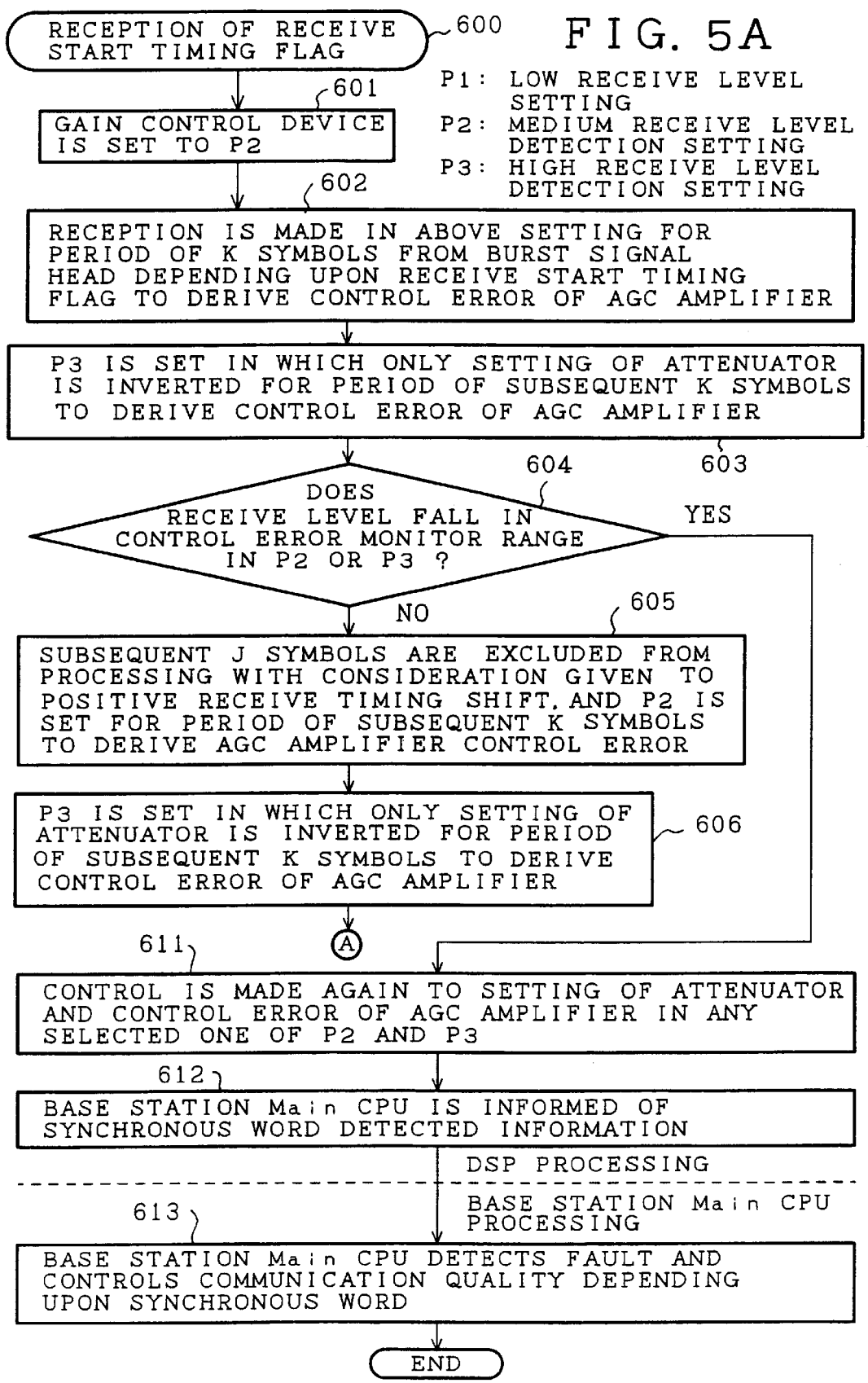

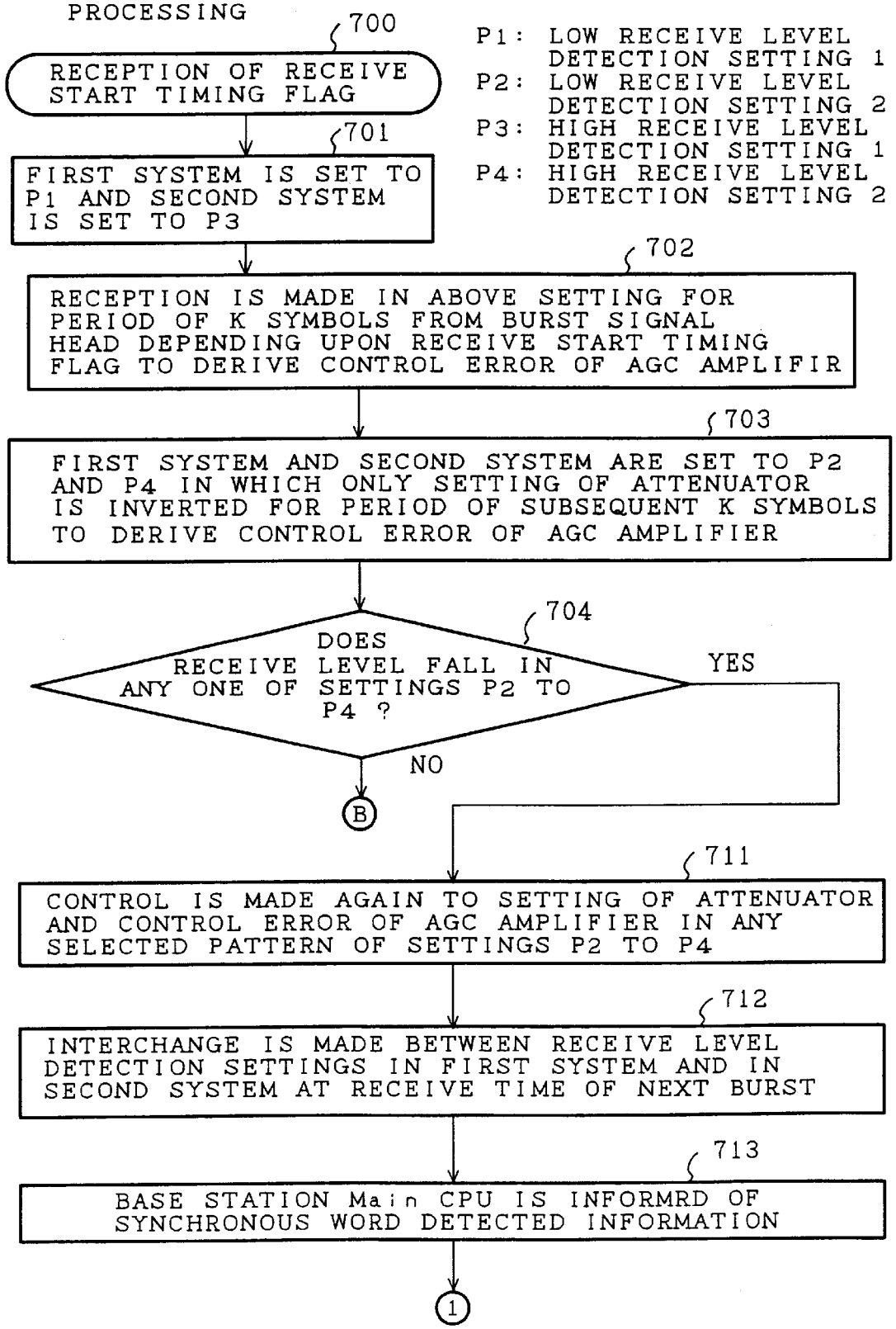

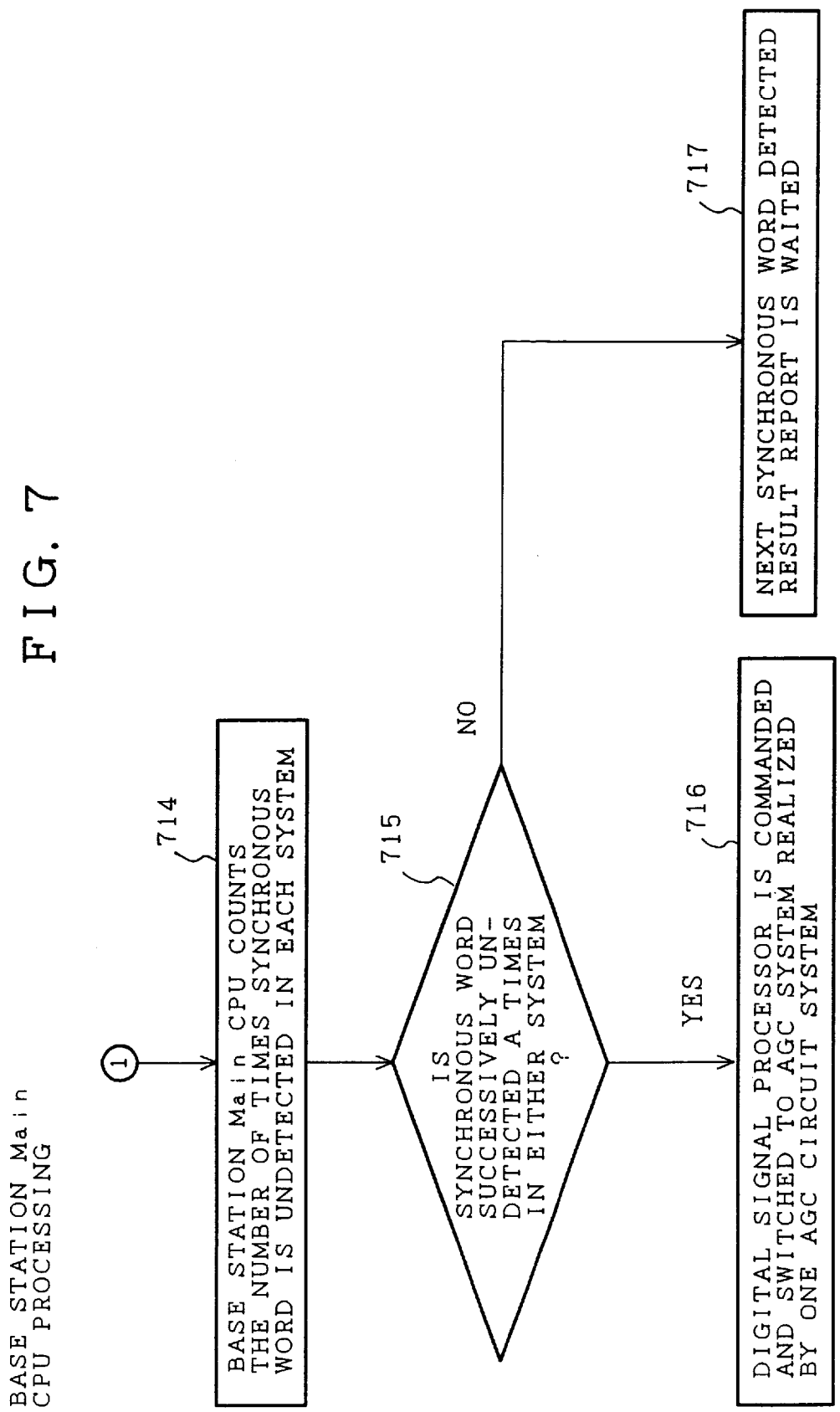

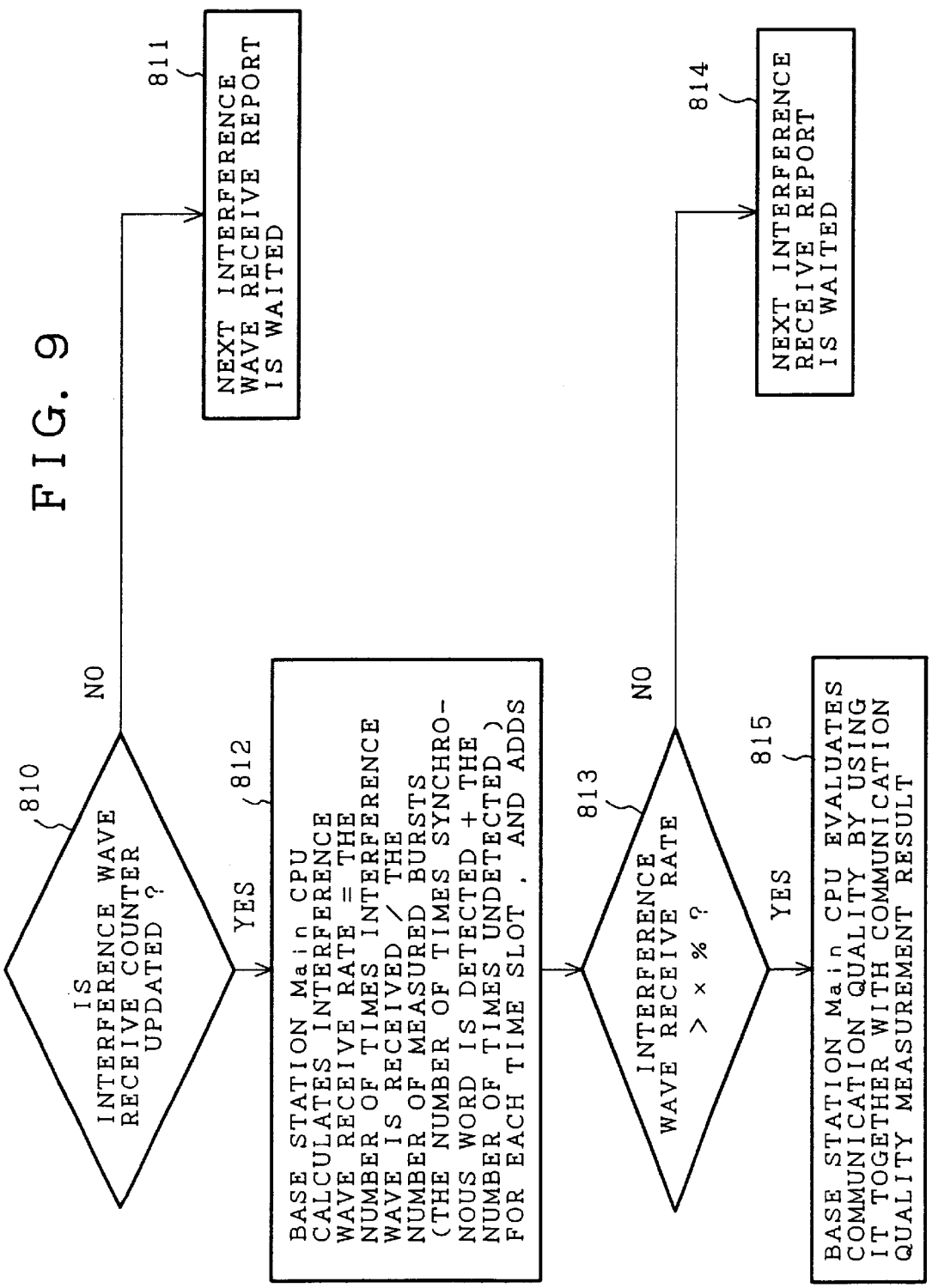

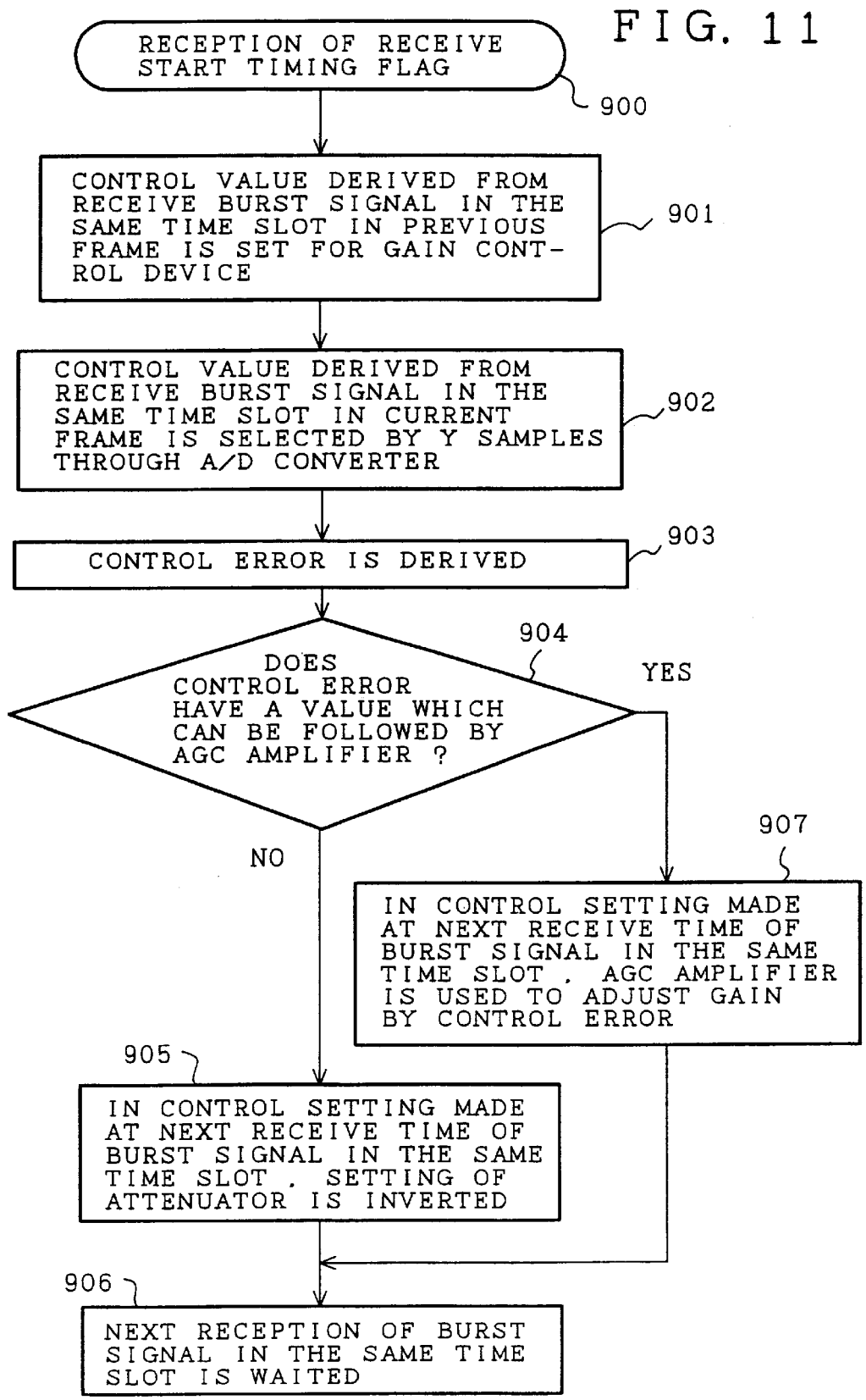

GAIN CONTROL METHOD AND RECEIVER

TECHNICAL FIELD

The present invention relates to a gain control method of controlling a gain of an input signal, and to a receiver.

BACKGROUND ART

FIG. 10 is a block diagram showing an illustrative circuit configuration of a receiver employing a digital AGC (Automatic Gain Control) system, and illustrating a receiver used in a radio base station. In the drawing, reference numeral 100 means an antenna, 200 is a receiver for use in a frequency band of RF to IF, 210 is a variable attenuator, 220 is an AGC amplifier, 310 is a quadrature detector, 320 is an A/D converter, 330 is a D/A converter, 340 is a control signal line for the variable attenuator, and 400 is a digital signal processor (DSP).

FIG. 11 is a flowchart showing an algorithm in the conventional AGC system.

Referring to FIG. 10, a first description will be given of the operation of the circuits in the receiver.

The antenna 100 receives a time division multiple access (hereinafter abbreviated as TDMA) RF signal transmitted from a mobile unit terminal. The receiver 200 performs down conversion of a signal in the RF band into a signal in the IF band.

In addition to the down conversion function, the receiver 200 has the AGC function of keeping through a gain control device a receive signal level at a constant level at which amplitude information is not lost. The AGC function is carried out by attenuation control by the variable attenuator 210 and amplification factor control by the AGC amplifier 220.

The attenuation control by the variable attenuator 210 includes control in steps of several decibels according to digital control in steps of several bits, ON/OFF control in steps of tens decibels, and so forth. A description will now be given of a case where the latter ON/OFF control in steps of tens decibels is used.

On the other hand, the AGC amplifier 220 can perform a successive gain control according to voltage.

The signal in the IF band outputted from the receiver 200 is inputted into the quadrature detector 310.

In the quadrature detector 310, an IF band modulated signal outputted from the receiver 200 is detected by a locked oscillator with substantially the same frequency as the IF band frequency, thereby outputting a baseband signal including an I component (in-phase component) and a Q component (quadrature component).

The baseband signal including the I component and the Q component outputted from the quadrature detector 310 is inputted into the A/D converter 320. For example, fourfold oversampling is made for each symbol in the signal including the I component or the Q component to output a several-bit quantized signal for each sample.

The quantized signal outputted from the A/D converter 320 is inputted into the digital signal processor 400 to execute the AGC algorithm as shown in FIG. 11.

Next, a description will now be given of the AGC algorithm in the prior art with reference to FIG. 11.

The digital signal processor 400 receives a receive start timing flag (Step 900). The receive start timing flag is known in the radio base station, and is transmitted for each burst signal with a receive timing shift of ±0 symbol from a mobile station.

The digital signal processor 400 receives the receive start timing flag to set a control value about a receive signal level derived from a receive burst signal in the same time slot in the previous frame for the gain control devices 210 and 220 through the control signal line 340 and the D/A converter 330. In such a manner, the ATT 210 and the AGC amplifier 220 serving as the gain control device are controlled to provide the same gain as that in the same time slot in the previous frame. The receiver 200 receives a burst signal in the same time slot in a current frame according to the set gain (Step 901).

The receive burst signal in the same time slot in the current frame is converted into the baseband signal including the I component and the Q component in the quadrature detector 310. For example, the fourfold oversampling is made to the baseband signal including the I component and the Q component in the A/D converter 320. The resultant Y samples are selected by the digital signal processor 400 (Step 902) to derive a control error to the gain control device setting made to the current receive burst signal (Step 903). The "control error" as used herein corresponds to a difference between a receive level and a desired level, and means a width to be converged by the gain control device.

Subsequently, it is decided whether or not the above control error can be followed by only the AGC amplifier (Step 904). When the control error can be followed by only the AGC amplifier, a fine adjustment is made to a gain corresponding to the above control error when a burst signal in the same time slot in the next frame is received (Step 907). Further, when the control error can not be followed by only the AGC amplifier, a rough adjustment is made to invert a setting of the variable attenuator when the burst signal in the same time slot in the next frame is received (Step 905).

In such a manner, it is determined which processing should be made to the burst signal in the same time slot in the next frame, thereafter waiting reception of a burst signal in the same time slot in the above next frame (Step 906).

As set forth above, when the conventional AGC system is used, the control is made to the receive burst signal in the same time slot in the next frame depending upon the control error of the receive burst signal in the same time slot in the previous frame. However, in a burst signal transmitted from the mobile station at a time of, for example, call, or channel switching, transmitting power is irregular due to a variation in distance between the mobile station and the radio base station, and so forth. Further, the burst signal is not always periodically transmitted for each frame, resulting in the aperiodic burst signal. Therefore, in the radio base station receiving such a burst signal, the previous frame can not used so that a receive level must be converged by the AGC to a desired value in a received burst signal in a current frame.

On the other hand, even if the conventional AGC system is applied to a periodic burst signal, only the control error to the receive burst signal can be used as information for the AGC, and the AGC system includes no means for detecting transmitting power control according to interference or silence at the mobile station. As a result, there is a problem in that an erroneous control may be made in the gain control.

Further, irrespective of the periodic burst signal or the aperiodic burst signal, there is another problem of an erroneous gain control when the receive timing is shifted.

DISCLOSURE OF THE INVENTION

In order to overcome the above problems, it is an object of the present invention to provide a gain control method and a receiver in which a gain can be converged in the early stages.

According to one aspect, for achieving the above-mentioned object, there is provided a gain control method used for a receiver including attenuating means for attenuating an input signal depending upon each of a first set value and a second set value, amplifying means for amplifying an input signal depending upon a control signal, and control means for generating the first set value, the second set value, and the control signal. The gain control method includes the decision step of deciding whether a receive level of an input signal falls in a first control error range corresponding to the first set value or a second control error range corresponding to the second set value, and the gain control step of controlling the gain by attenuating an input signal in the attenuating means depending upon the first set value when it is decided in the decision step that the receive level falls in the first control error range and depending upon the second set value when it is decided that the receive level falls in the second control error range, and amplifying an input signal in the amplifying means.

In particular, when a receive level of an input signal falls in neither the first control error range nor the second control error range in the decision step, the decision is made again after the elapse of a predetermined time period.

Further, according to another aspect, there is provided a gain control method used for a receiver including attenuating means for attenuating an input signal depending upon each of a first set value and a second set value, amplifying means for amplifying an input signal by at least a low gain or a high gain depending upon a control signal, and control means for generating the first set value, the second set value, and the control signal. The gain control method includes the decision step of deciding whether a receive level of an input signal falls in a first control error range corresponding to the first set value or a second control error range corresponding to the second set value, and the gain control step of controlling a gain by making a gain control to an input signal depending upon the first set value when it is decided in the decision step that the receive level of the input signal falls in the first control error range and depending upon the second set value when it is decided that the receive level falls in the second control error range, and controlling the amplifying means to a high gain when a receive level of an input signal falls in neither the first control error range nor the second control error range.

In particular, the first set value for the attenuating means serves as a set value to turn ON the attenuating means, and the second set value serves as a set value to turn OFF the attenuating means.

Further, the attenuating means includes amplifying means selected corresponding to the first set value, and second attenuating means selected corresponding to the second set value.

Further, according to a further aspect, there is provided a gain control method used for a receiver including first attenuating means for attenuating an input signal depending upon each of a first set value and a second set value, second attenuating means for attenuating an input signal depending upon each of a third set value and a fourth set value, first amplifying means for amplifying an output signal from the first attenuating means depending upon a first control signal, second amplifying means for amplifying an output signal from the second attenuating means depending upon a second control signal with a higher gain than that of the first amplifying means, and control means for generating the first, second, third, and fourth set values, and the first and second control signals. The gain control method includes the decision step of deciding in which of a first control error range corresponding to the first set value, a second control error range corresponding to the second set value, a third control error range corresponding to the third set value, and a fourth control error range corresponding to the fourth set value a receive level of an input signal falls, and the gain control step of controlling the gain by attenuating and amplifying an input signal depending upon the set value and the amplifying means corresponding to the control error range in which the receive level of the input signal falls.

In particular, when the receive level of the input signal does not fall in any one of the first control error range, the second control error range, the third control error range, and the fourth control error range in the decision step, the decision is made again after the elapse of a predetermined time period.

Further, after the gain control step, the second control signal is added to the first amplifying means, and the first control signal is added to the second amplifying means, thereby performing the decision step and the gain control step.

In particular, the respective control error ranges are set to overlap each other by a predetermined range.

Further, a gain control method further includes the evaluation step of evaluating a communication state depending upon a received synchronous word after a gain control in the gain control step.

There is provided a gain control method further including the evaluation step of evaluating a communication state depending upon a received synchronous word after a gain control in the gain control step, and the reception limitation step of, when an abnormality of the communication state is detected in the evaluation step, limiting reception by attenuating means and amplifying means on side on which the abnormality is detected.

According to a still further aspect, there is provided a receiver including attenuating means for attenuating an input signal depending upon each of a first set value and a second set value, amplifying means for amplifying an input signal depending upon a control signal, and control means for generating the first set value, the second set value, and the control signal. In the receiver, the control means includes deciding means for deciding whether a receive level of an input signal falls in a first control error range corresponding to the first set value or a second control error range corresponding to the second set value, and gain control means for controlling the gain by attenuating an input signal in the attenuating means depending upon the first set value when it is decided in the deciding means that the receive level falls in the first control error range and depending upon the second set value when it is decided that the receive level falls in the second control error range, and amplifying an input signal in the amplifying means.

According to another aspect, there is provided a receiver including attenuating means for attenuating an input signal depending upon a set value, amplifying means for amplifying an input signal depending upon a control signal, and control means for generating the set value, and the control signal. In the receiver, the control means generates the set value and the control signal depending upon an average of values of a plurality of past control errors.

In particular, when a synchronous word contained in an input signal is undetected, and a control error derived from a portion other than a synchronous word is equal to or less than a predetermined value, the control means decides that this is caused by silence processing on the transmitting side, and the control error is excluded from a plurality of past control errors used to find the average.

Further, when a synchronous word contained in an input signal is undetected, and a control error derived from a portion other than a synchronous word is equal to or more than a predetermined value, the control means decides that this is caused by an interference wave to an input signal, and the control error is excluded from a plurality of past control errors used to find the average.

BRIEF DESCRIPTION OF THE DRAWINGS

FIGS. 5A and 5B are a flowchart showing an algorithm in the AGC system according to the embodiment 1 of the present invention;

FIGS. 6A and 6B are a flowchart showing an algorithm in the AGC system according to the embodiment 2 of the present invention;

FIG. 7 is a flowchart showing the algorithm in the AGC system according to the embodiment 2 of the present invention;

FIG. 9 is a flowchart showing the algorithm in the AGC system according to the embodiment 3 of the present invention;

FIG. 11 is a flowchart showing an algorithm in the AGC system in the prior art.

BEST MODE FOR EMBODYING THE INVENTION

A description will now be given of preferred embodiments of the present invention.

Embodiment 1

Figure 1:
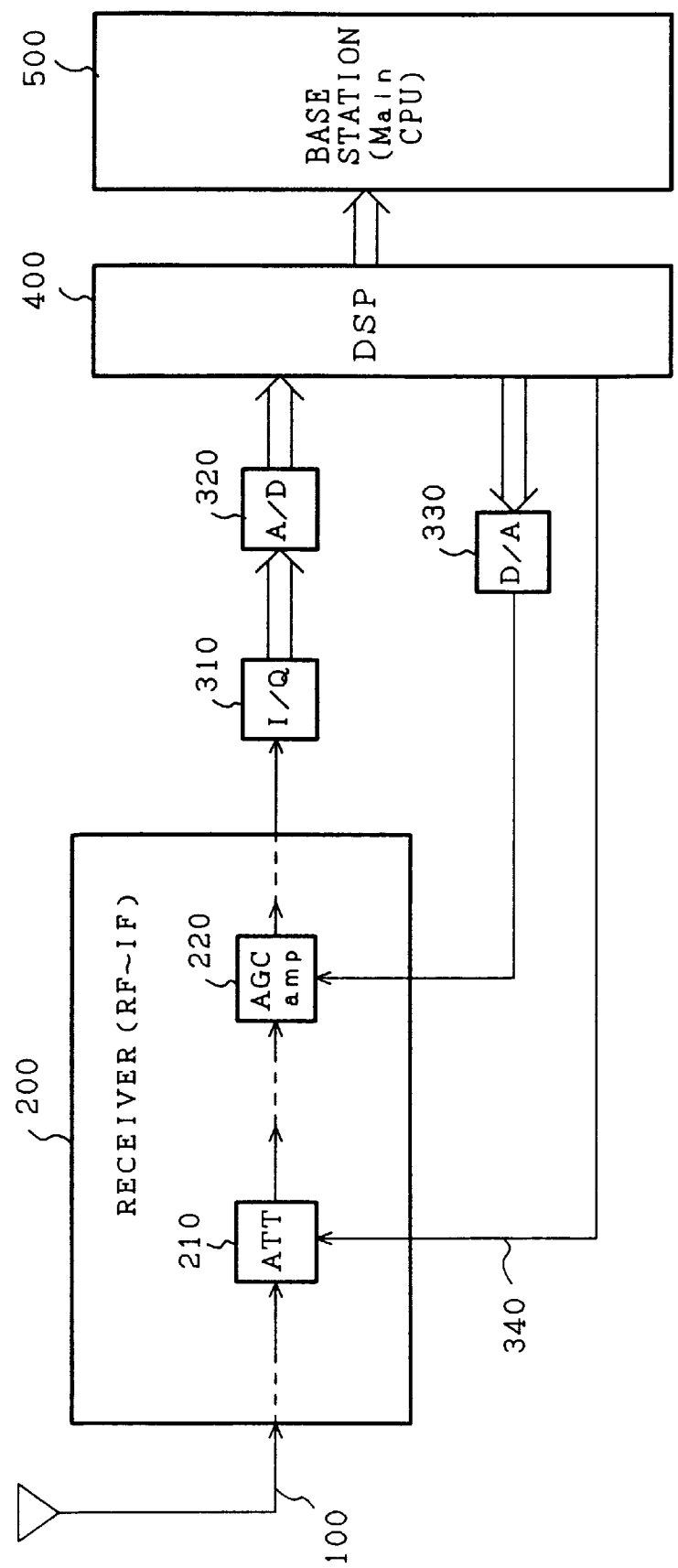
FIG. 1 is a block diagram showing a configuration of a receiver to realize an AGC system according to the embodiment 1 of the present invention.

A description will now be given of the embodiment 1 with reference to the drawings. FIG. 1 is a block diagram showing one illustrative configuration of a receiver to realize an AGC system according to the embodiment 1, and particularly illustrating the receiver mounted in a radio base station. In the drawing, reference numeral 100 means an antenna for transmission and reception of a signal between the radio base station and a plurality of mobile stations, and 200 is a receiver connected to the antenna 100, for use in a frequency band of RF to IF.

Reference numeral 210 means a variable attenuator mounted in the receiver 200 to attenuate a signal received from the antenna 100.

Reference numeral 220 means an AGC amplifier mounted in the receiver 200 to amplify a signal outputted from the variable attenuator 210. Reference numeral 310 means a quadrature detector for quadrature detection of a signal outputted from the receiver 200, 320 is an A/D converter to convert an analog signal serving as an output signal of the quadrature detector 310 into a digital signal, and 400 is a digital signal processor (DSP) to take as input the digital signal obtained by A/D conversion in the A/D converter 320.

Reference numeral 330 means a D/A converter to convert a control signal outputted from the DSP 400 to the AGC amplifier 220 into an analog signal, and 340 is a control signal line outputted from the DSP 400 to the variable attenuator 210.

Reference numeral 500 means a base station Main CPU to swap a signal with the DSP 400. The base station Main CPU 500 receives from the digital signal processor 400 reports on synchronous word detected/undetected information and interference wave received information, and detects fault and controls communication quality in the digital signal processor 400 or earlier steps of the receiver.

Figure 5B:
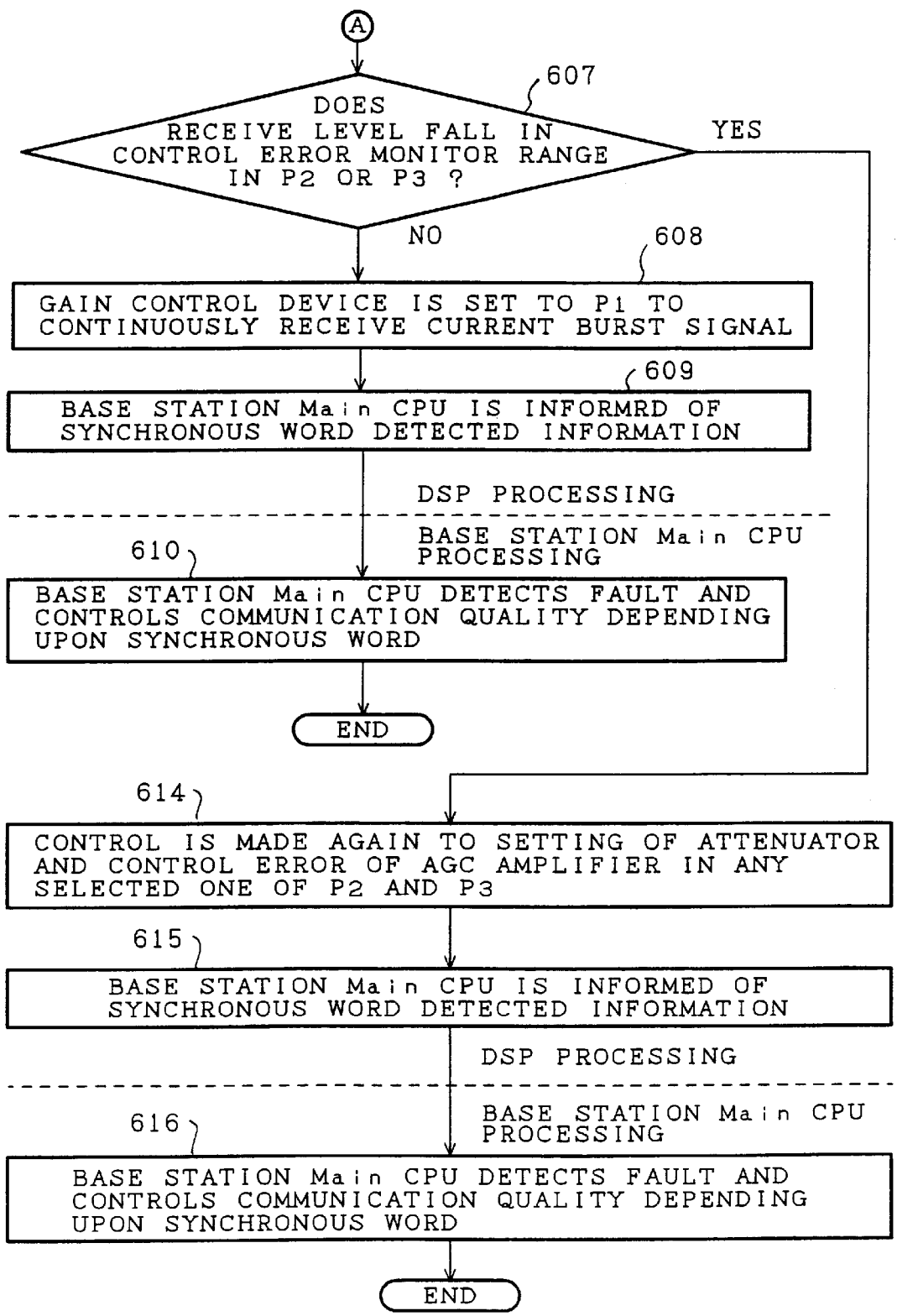

Further, FIGS. 5A and 5B are a flowchart showing an algorithm in the AGC system according to the embodiment 1.

Subsequently, a description will be given of the AGC system according to the embodiment 1 with reference to the illustrative configuration of FIG. 1 and the flowchart of FIGS. 5A and 5B.

The digital signal processor 400 receives a receive start timing flag (Step 600). The receive start timing flag is known in the radio base station, and is transmitted for each burst signal with a receive timing shift of ±0 symbol from the mobile station.

The digital signal processor 400 receives the receive start timing flag to set the variable attenuator 210 and the AGC amplifier 220 serving as a gain control device to a medium receive level detection setting (hereinafter abbreviated as P2 in the description of the embodiment 1) through the control signal line 340 and the D/A converter 330 (Step 601). The "medium receive level detection setting P2" as used herein means a setting in which the variable attenuator 210 is set to OFF, and the AGC amplifier is set to a low gain. In this state, a burst signal received through the antenna 100 is inputted into the receiver 200 to be outputted according to P2. Here, the signal inputted into the variable attenuator 210 is directly outputted without attenuation. A signal outputted from the receiver 200 is converted by the quadrant detector 310 into a baseband signal including an I component and a Q component. In the A/D converter 320, M-fold (for example, fourfold) oversampling is made to the baseband signal including the I component and the Q component. Further, the digital signal processor 400 selects K symbols (for example, two symbols) starting from the head of the burst signal×M samples on the basis of the receive start timing flag. The digital signal processor 400 calculates a control error of the AGC amplifier in P2 depending upon the selected information (Step 602). After P2 is set for a period of the K symbols from the head of the burst signal, a high receive level detection setting (hereinafter abbreviated as P3 in the description in the embodiment 1) is set for a period of subsequent K symbols. Further, when P3 is set, the control error of the AGC amplifier is additionally calculated (Step 603). The "P3" as used herein means a setting in which the variable attenuator 210 is set to ON, and the AGC amplifier is set to a low gain.

A control error monitor range of the AGC amplifier in P3 is smaller than that in P2 by an amount attenuated by the variable attenuator 210 (by, for example, 48 dB) since the variable attenuator 210 is set to ON.

In the above manner, the control error in P2 and the control error in P3 are derived.

Through the above operation, it is decided whether or not a receive level of a receive burst signal falls in the control error monitor range of the AGC amplifier in any one of P2 and P3 (Step 604).

If the receive level falls in the control error monitor range in P2 or P3, the variable attenuator 210 is set for a setting corresponding to the control error monitor range in which the receive level falls. Further, depending upon the previously derived control error of the AGC amplifier, a control is made again to compensate for the control error in the setting (Step 611). For example, when it is found that the receive level falls in the control error monitor range in P2, the variable attenuator 210 is set to OFF, and the AGC amplifier is set to the low gain.

After the control is made again in Step 611, the DSP 400 continues to receive a burst signal to detect a synchronous word contained in the receive burst signal. The DSP 400 informs the base station Main CPU of the synchronous word detected/undetected information showing whether or not the synchronous word is detected (Step 612). The base station Main CPU detects the fault and controls the communication quality in the receiver depending upon the synchronous word detected/undetected information (Step 613). For example, when no synchronous word is detected, it is decided that the receiver fails, or the communication quality deteriorates.

If the receive level falls in neither the control error range in P2 nor the control error range in P3, no processing is made for a period of subsequent J symbols.

The above processing is made because of the following fact. When the receive timing is shifted toward the positive side, that is, a signal is received from the mobile station with the receive timing lagging a desired receive timing, the signal possibly may not be received because of the timing used to derive the control error in Steps 602 and 603. In this case, if the control error is derived based upon the used receive timing though the signal has not been received yet, a decision of a low receive level may erroneously be made to the signal having a predetermined receive level in actuality. Therefore, in the embodiment, it is assumed that the receive timing is shifted, the receive level is measured again depending on timing on which compensation can be made for the shift.

For example, for K=2, the expression: J=1 (5–4) permits consideration given to the possibility that the receive timing shift ranges to +5 symbols since four symbols (K×2) are required to derive each control error in the P2 and the P3.

After no processing is made for the period of the J symbols, a signal is received again in P2 for a period of subsequent K symbols. Then, a control error of the AGC amplifier is derived in the digital signal processor 400 (Step 605).

Further, a signal is received in P3 for a period of K symbols, thereby deriving the control error of the AGC amplifier in the digital signal processor 400 (Step 606).

From Steps 605 and 606, it is decided whether or not the receive level of the receive burst signal falls in any one of the control error monitor ranges of the AGC amplifier in P2 and P3 (Step 607).

If the receive level falls in the control error monitor range in P2 or P3, the variable attenuator 210 is set according to any one of them, and a control is made again to the control error of the AGC amplifier previously derived in the setting, thereby converging the receive level (Step 614).

As set forth above, in Steps 605, 606, and 607, the operation is carried out a plurality of times to derive whether or not the receive level falls in the predetermined control error monitor ranges. As a result, even in case of shifted receive timing, it is possible to accurately derive the receive level without erroneous recognition.

The DSP 400 detects a synchronous word with respect to a receive burst signal which is received after an additional control in Step 614. The DSP 400 informs the base station Main CPU of synchronous word detected information (Step 615). The base station Main CPU detects the fault and controls the communication quality in the receiver depending upon the synchronous word detected information (Step 616).

If the receive level falls in neither the control error range in P2 nor the control error range in P3, the variable attenuator 210 is set to OFF, and the AGC amplifier 220 is set to a high gain, resulting in a low receive level detection setting (hereinafter abbreviated as P1 in the description in the embodiment 1) (Step 608).

Further, the base station Main CPU is informed of synchronous word detected information of the same receive burst signal received in succession through P1 (Step 609). The base station Main CPU detects the fault and controls the communication quality in the receiver depending upon the information (Step 610).

As stated above, the processing can be carried out by effectively using the ON/OFF operation of the variable attenuator having a rapid transient response as shown in the flowchart of FIGS. 5A and 5B. It is thereby possible to converge the AGC with fewer symbols including an AGC control value determining time of K×2 symbols +a transient response time of a gain control device (of tens microseconds; 2 to 4 symbols) in the shortest time.

Further, even in case of occurrence of the positive receive timing shift or the lower receive input level, it is possible to converge the AGC with fewer symbols including the above time period +J symbols +K×2 symbols. That is, when an aperiodic burst signal having irregular transmitting power from the mobile station or a first burst signal of a periodic burst signal is received, it is possible to particularly converge an AGC for a period of several symbols from the head of the burst signal, and realize the AGC closed in one burst, in which a signal reception is enabled without losing amplitude information of the same burst signal in succession.

Figure 2:
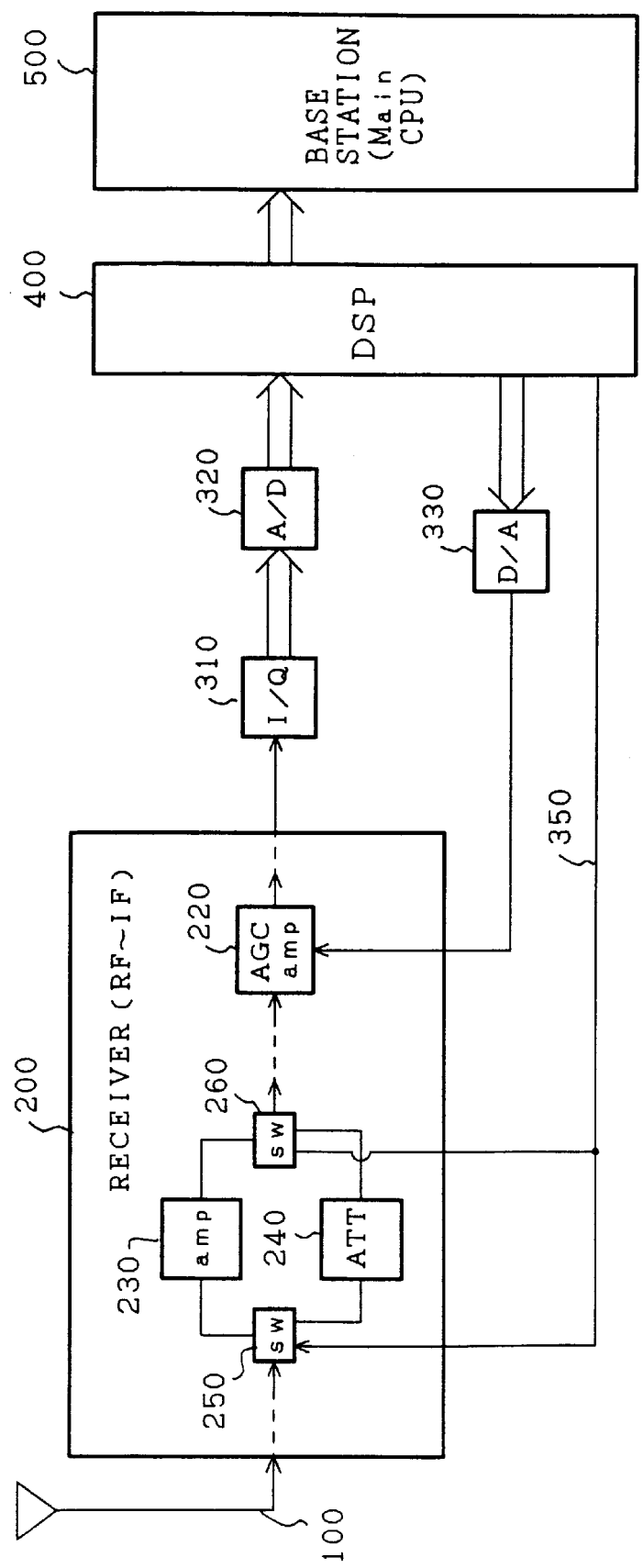
FIG. 2 is a block diagram showing a configuration of a receiver to realize the AGC system according to the embodiment 1 of the present invention.

FIG. 2 is a block diagram showing a second illustrative configuration of a receiver to realize the AGC system according to the embodiment 1. In the drawing, reference numeral 230 means a fixed-gain amplifier, and 250, 260 are switches with a rapid transient response time of several nanoseconds.

In the configuration of the receiver shown in FIG. 2, a basic control is similarly made according to the flowchart shown in FIGS. 5A and 5B. However, P1, P2, and P3 are set by the switch 250 and the switch 260 as follows:

P1: the amplifier 230 is selected, and the AGC amplifier is set to a high gain;

P2: the amplifier 230 is selected, and the AGC amplifier is set to a low gain; and P3: the attenuator 240 is selected, and the AGC amplifier is set to a low gain.

The receiver shown in FIG. 2 can provide the same effects as those in the receiver shown in FIG. 1.

Embodiment 2

The embodiment 2 particularly relates to a receiver having two AGC circuit systems which can discretely be controlled.

Figure 3:
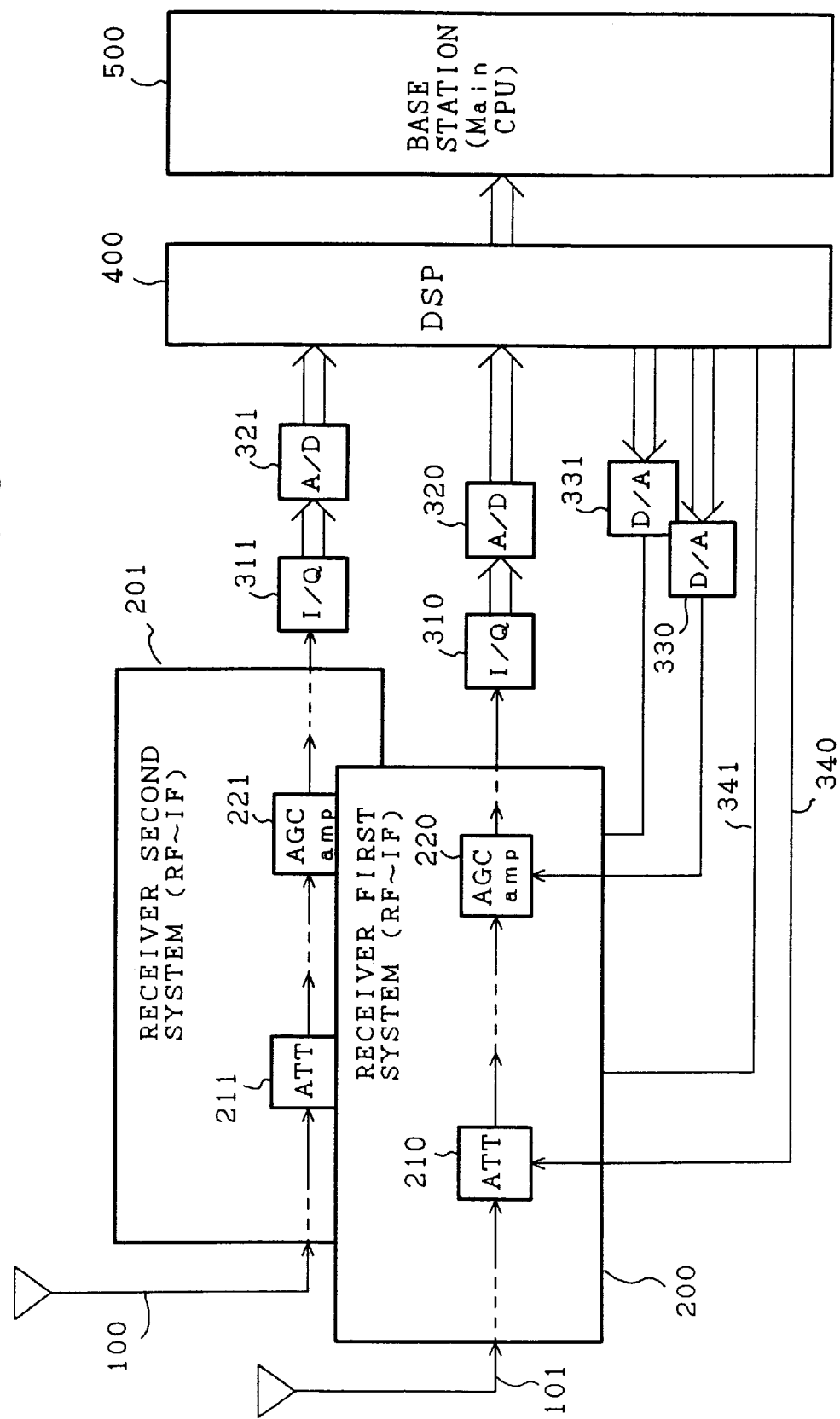
Fig. 3 is a block diagram showing a configuration of a receiver to realize an AGC system according to the embodiment 2 of the present invention.

FIG. 3 is a diagram showing a configuration of the receiver according to the embodiment 2.

In FIG. 3, reference numeral 101 means an antenna in a first system, 210 is a variable attenuator in the first system, 220 is an AGC amplifier in the first system, 310 is a quadrature detector in the first system, 320 is an A/D converter in the first system, 330 is a D/A converter in the first system, and 340 is a control signal line to the variable attenuator in the first system. Reference numeral 100 means an antenna in a second system, 211 is a variable attenuator in the second system, 221 is an AGC amplifier in the second system, 311 is a quadrature detector in the second system, 321 is an A/D converter in the second system, 331 is a D/A converter in the second system, and 341 is a control signal line to the variable attenuator in the second system.

Figure 6B:
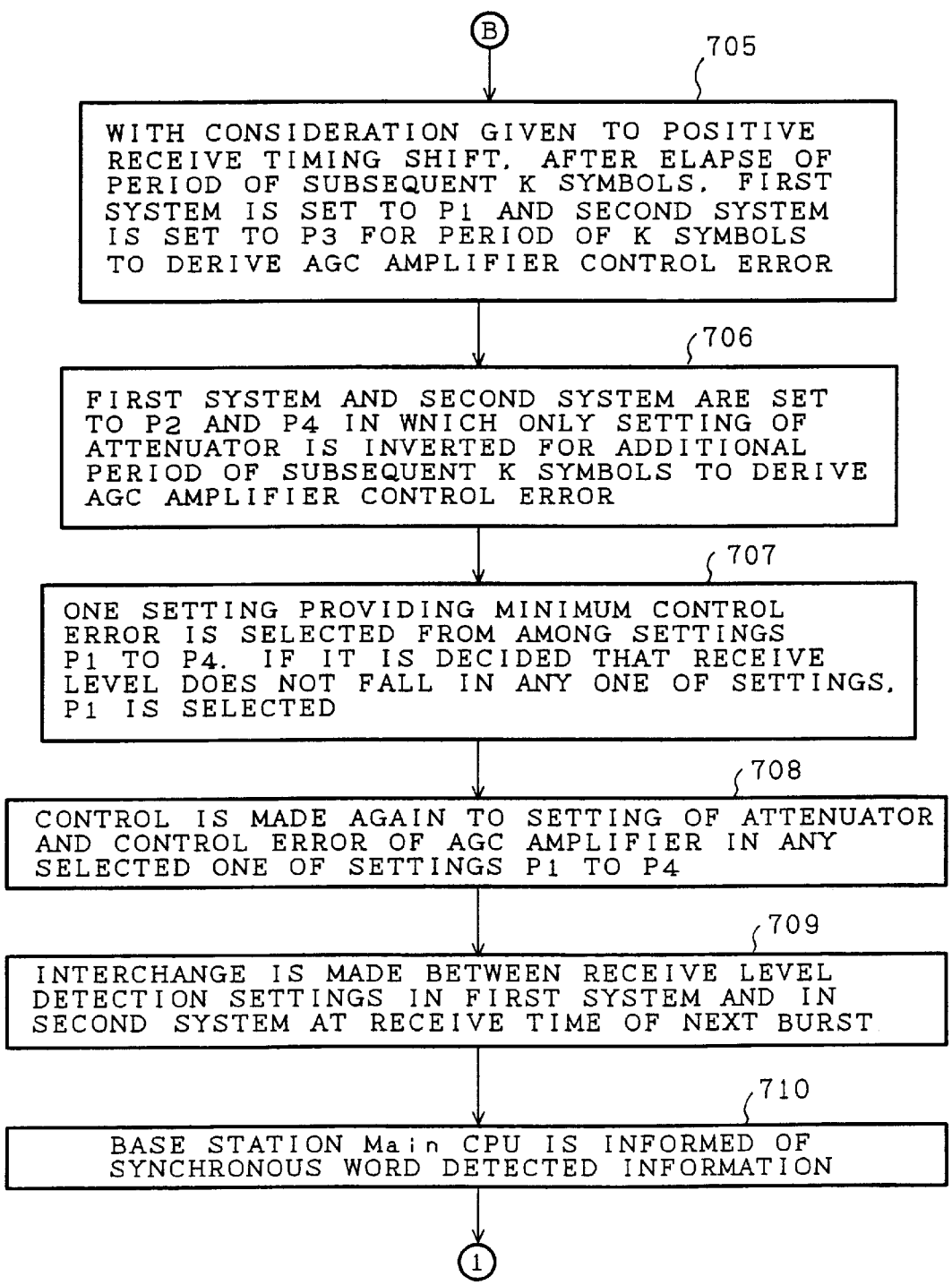

FIGS. 6A, 6B and 7 are flowcharts showing an algorithm in the AGC system according to the embodiment 2. The embodiment 2 relates to the AGC system in which the AGC amplifiers in the first and second systems are differently set to any one of fixed low and high gains, and two types of receive level detection settings including an ON/OFF operation of the variable attenuator are made for each system to enable a total of four settings of the receive level.

Next, a description will now be given of the operation of the receiver according to the embodiment 2 with reference to the illustrative configuration of FIG. 3, and the flowcharts of FIGS. 6A, 6B and 7.

The digital signal processor 400 receives a receive start timing flag (Step 700). The receive start timing flag is known in the radio base station, and is transmitted for each burst signal with a receive timing shift of ±0 symbol.

The digital signal processor 400 receives the receive start timing flag to set the variable attenuators 210, 211 and the AGC amplifiers 220, 221 serving as a gain control device to a first system low receive level detecting setting 1 and a second system high receive level detection setting 1 (hereinafter respectively abbreviated as P1 and P3 in the description of the embodiment 2) through the control signal lines 340, 341 and the D/A converters 330, 331 (Step 701).

That is, the receiver first system is set to P1, and the receiver second system is set to P3. Here, the P1 is a setting in which the variable attenuator 210 is set to OFF and the AGC amplifier 220 is set to a high gain. The P3 is a setting in which the variable attenuator 211 is set to OFF and the AGC amplifier 221 is set to a low gain.

A signal outputted from the receiver 200 is inputted into the quadrant detector 310, and a signal outputted from the receiver 201 is inputted into the quadrant detector 311. In the quadrant detectors 310, 311, each input signal is converted into a baseband signal including an I component and a Q component. The A/D converters 320, 321 make an M-fold (for example, fourfold) oversampling to output signals from the quadrant detectors 310, 311.

The digital signal processor 400 selects K symbols (for example, two symbols) starting from the head of the burst signal×M samples on the basis of the receive start timing flag.

The digital signal processor 400 derives a control error of the AGC amplifier in the setting P1 by the first system, and derives a control error of the AGC amplifier in the setting P3 by the second system (Step 702).

For a period of subsequent K symbols, the first system is set to a low receive level detection setting 2 (hereinafter abbreviated as P2 in the description of the embodiment 2), and the second system is set to a high receive level detection setting 2 (hereinafter abbreviated as P4 in the description of the embodiment 2). Here, the P2 is a setting in which the variable attenuator 210 is set to ON and the AGC amplifier 220 is set to a high gain. The P4 is a setting in which the variable attenuator 211 is set to ON and the AGC amplifier 221 is set to a low gain.

The digital signal processor 400 calculates a control error of the AGC amplifier in the P2 and P4 (Step 703).

Through the above operation, it is decided whether or not a receive level of a receive burst signal falls in the control error monitor range of the AGC amplifier in any one of P2, P3, and P4 (Step 704).

If the receive level falls in the control error monitor range in any one of P2, P3, and P4, the first system variable attenuator 210 and the second system variable attenuator 211 are set for a setting corresponding to the control error monitor range in which the receive level falls. Further, a control is made again by the first system AGC amplifier 220 and the second system AGC amplifier 221 to converge the control error of the AGC amplifier previously derived in the setting (Step 711).

Further, when the next burst signal is received, an interchange is made between the receive level detection setting made in the first system and the receive level detection setting made in the second system (Step 712).

The interchange can prevent a malfunction even when any one of the first system and the second system fails.

After the control is made again in Step 711, the DSP 400 continues to receive a burst signal to detect a synchronous word contained in a receive burst signal. The DSP 400 informs the base station Main CPU of the synchronous word detected information showing whether or not the synchronous word is detected (Step 713). The base station Main CPU detects the fault and controls the communication quality in the receiver depending upon the synchronous word detected information. For example, when no synchronous word is detected, it is decided that the receiver fails, or the communication quality deteriorates.

If the receive level does not fall in the error range in any one of P2, P3, and P4, no processing is made for a period of subsequent J symbols. No processing is made because of the same reason as that for which no processing is made in the embodiment 1.

For example, for K=2, the expression: J=1 (5−4) permits consideration given to the possibility that the receive timing shift ranges to +5 symbols since four symbols (K×2) are required to derive the respective control errors in the P2 and the P3.

After no processing is made for the period of the J symbols, P1 is set in the first system and P3 is set in the second system again to receive a signal for a period of subsequent K symbols. Then, a control error of the AGC amplifier is derived in the digital signal processor 400 (Step 705). Further, P2 is set in the first system and P4 is set in the second system to receive a signal for a period of subsequent K symbols, thereby deriving a control error of the AGC amplifier in the digital signal processor 400 (Step 706).

From Steps 705 and 706, one setting providing the minimum control error is selected from among the P2, P3, and P4. If the minimum control error can not be found in any one of the settings, P1 is selected (Step 707).

A setting for the variable attenuator in the selected setting is made to the variable attenuator 210 in the first system and the variable attenuator 211 in the second system, and a control is made again to the control error of the AGC amplifier previously derived in the setting in the first system AGC amplifier 220 and the second system AGC amplifier 221, thereby converging the receive level (Step 708).

When the next burst signal is received, an interchange is made between the receive level detection setting made in the first system and the receive level detection setting made in the second system (Step 709). The interchange between the first system and the second system can prevent a malfunction even when any one of the systems fails.

As set forth above, in Steps 705, 706, and 707, the operation is carried out a plurality of times to derive whether or not the receive level falls in the predetermined control error monitor range. As a result, even in case of shifted receive timing, it is possible to accurately derive the receive level without erroneous recognition.

The DSP 400 detects a synchronous word with respect to a receive burst signal which is received after the additional control in Step 614. The DSP 400 informs the base station Main CPU of synchronous word detected information (Step 710). The base station Main CPU 500 detects the fault and controls the communication quality in the receiver depending upon the synchronous word detected information.

The base station Main CPU 500 detects the fault and controls the communication quality in the receiver according to the procedure discussed infra.

Depending upon the synchronous word detection result obtained in Steps 713 and 710, the number of times the synchronous word is undetected is counted for each system (Step 714). As a result, it is decided whether or not the synchronous word is successively undetected A times in the optional system (Step 715).

The base station Main CPU 500 decides that, when the synchronous word is successively undetected A times in the optional system, the receive system fails, and commands the digital signal processor 400 to receive a signal by another normally running receive system. In this case, as illustratively described in the embodiment 1, the signal is received by only the single receive system (Step 716).

When the synchronous word is not successively undetected A times in the optional system, the base station Main CPU 500 waits the next synchronous word detection result report by the digital signal processor 400 (Step 717).

Meanwhile, P1 and P2, P2 and P3, and P3 and P4 are respectively defined as adjacent receive level detection settings in which control error monitor ranges overlap each other by p Db (for example, 10 dB) on the positive side and q dB (for example, 20 dB) on the negative side with respect to a desired receive input level of each setting. It is thereby possible to absorb a variation in receive level with no correlation received through each of the first system antenna 100 and the second system antenna 101, and apply a setting for the variable attenuator and a control value for the AGC amplifier selected and derived in one system to the other system.

Further, even if a variable attenuator having the same amount of attenuation and an AGC amplifier having the same dynamic range are used, an increase in the number of receive level detection settings permits a greater extension of a dynamic range of the AGC than would be in an AGC system realized by only an AGC circuit system in the first system.

As stated above, the two AGC circuit systems as shown in the flowcharts of FIGS. 6A, 6B and 7 can be used to perform the processing effectively using the ON/OFF operation of the variable attenuator having a rapid transient response. Even in such a case, it is possible to converge the AGC with fewer symbols including an AGC control value determining time of K×2 symbols +a transient response time of a gain control device (of tens microseconds; 2 to 4 symbols) in the shortest time. Further, even in case of an occurrence of a positive receive timing shift or a lower receive input level, it is possible to converge the AGC within a time period including the above time period +J symbols +K×2 symbols. In particular, at a time of receiving a first burst signal of an aperiodic burst signal having irregular transmitting power from a mobile station or a periodic burst signal, it is possible to converge the AGC for a period of several symbols from the head of the burst signal, and realize an AGC closed in one burst, in which a signal reception is enabled without losing amplitude information of the same burst signal in succession.

Figure 4:
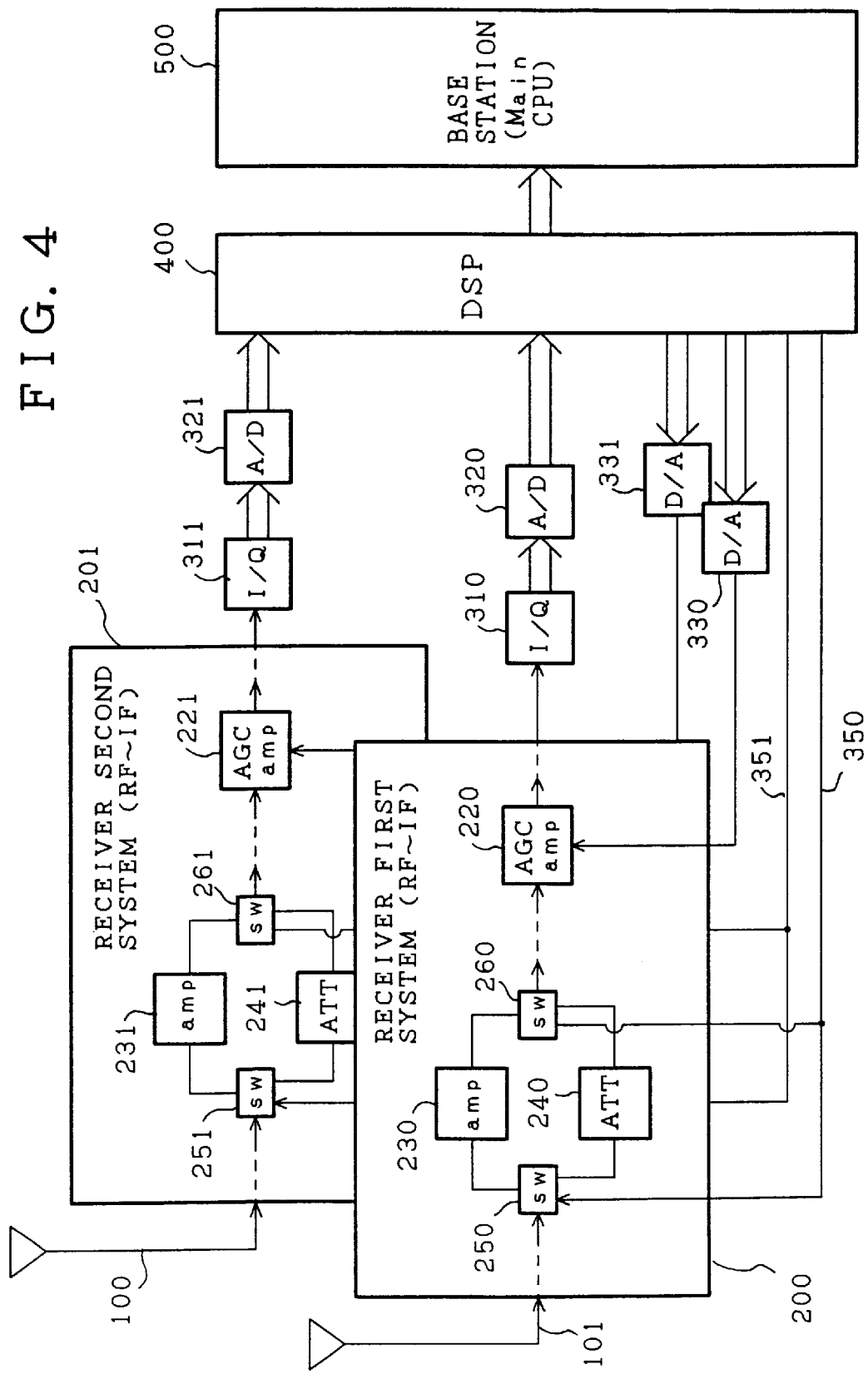
FIG. 4 is a block diagram showing a configuration of a receiver to realize the AGC system according to the embodiment 2 of the present invention.

FIG. 4 is a diagram showing another illustrative configuration of the receiver according to the embodiment 2.

In FIG. 4, reference numeral 231 means a fixed-gain amplifier in a second system, 241 is an attenuator in the second system with a fixed amount of attenuation, 251, 261 are switches in the second system, and 351 is a control signal line to the switches in the second system. In the configuration of the receiver shown in FIG. 4, a basic control is similarly made according to the flowchart shown in FIGS. 6A and 6B.

However, settings P1, P2, P3, and P4 are respectively set by a switch 250, the switch 251, a switch 260, and the switch 261 as follows:

P1: an amplifier 230 is selected, and the AGC amplifier is set to a high gain;

P2: an attenuator 240 is selected, and the AGC amplifier is set to a high gain;

P3: the amplifier 231 is selected, and the AGC amplifier is set to a low gain; and P4: the attenuator 241 is selected, and the AGC amplifier is set to a low gain.

The receiver shown in FIG. 4 can provide the same effects as those in the receiver shown in FIG. 3.

Embodiment 3

Figure 8A:
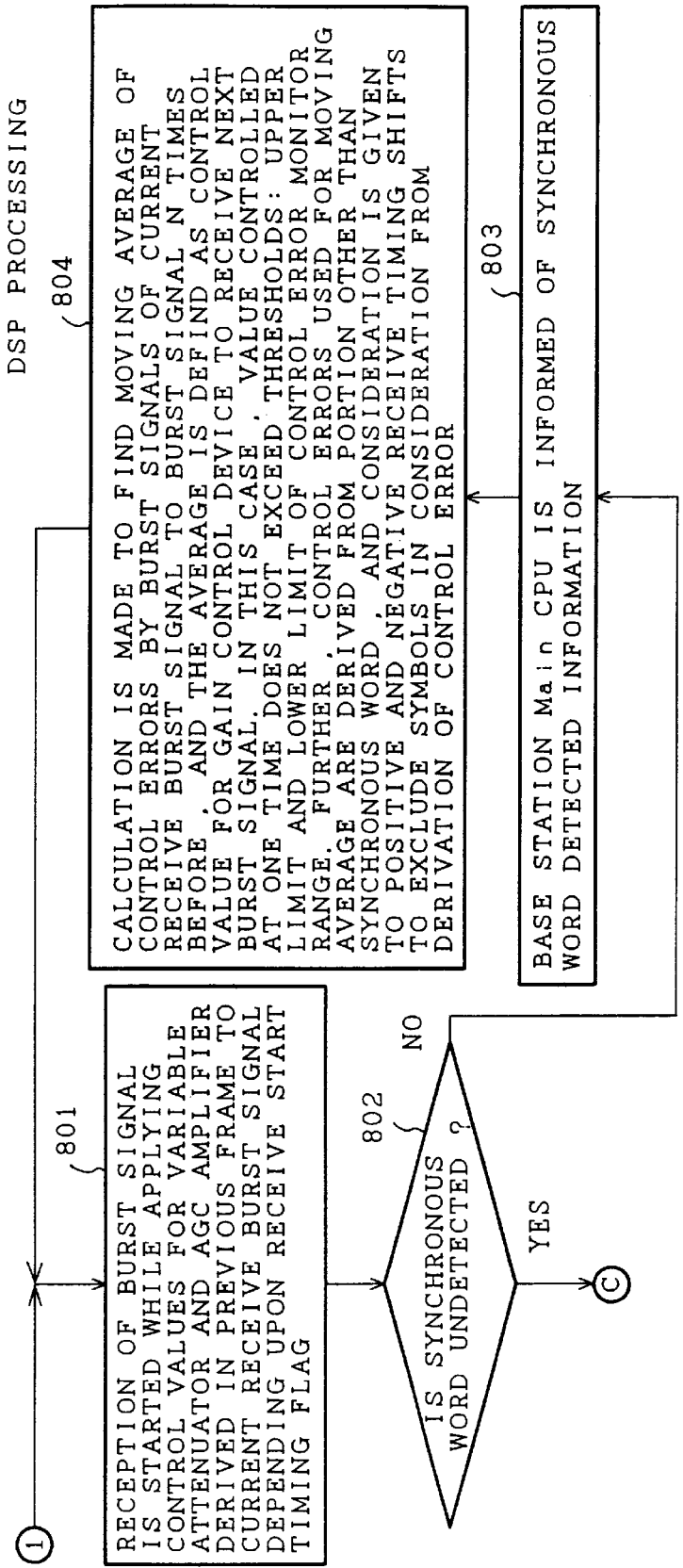
FIGS. 8A and 8B are a flowchart showing an algorithm in an AGC system according to the embodiment 3 of the present invention.
Figure 8B:
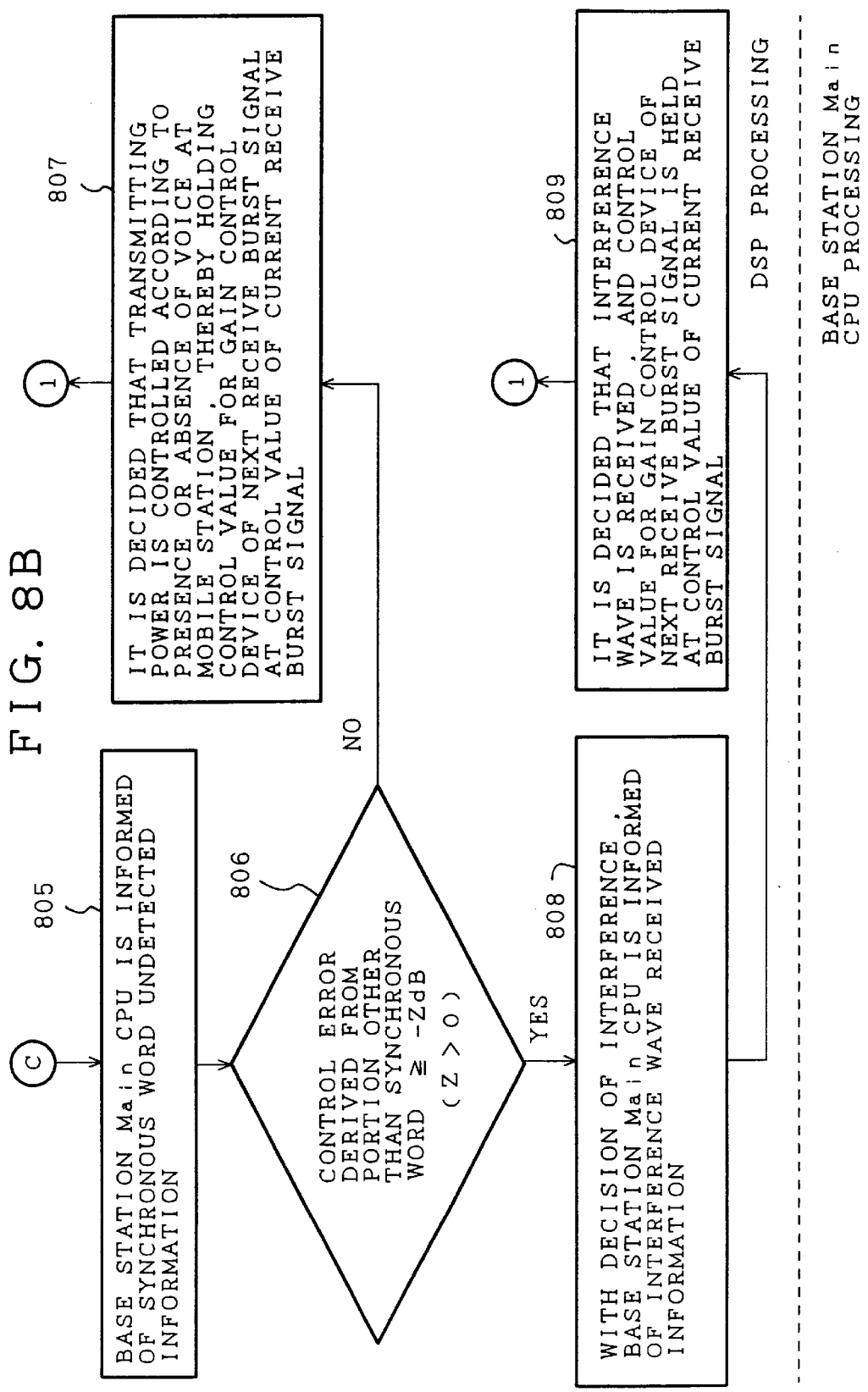
Figure 10:
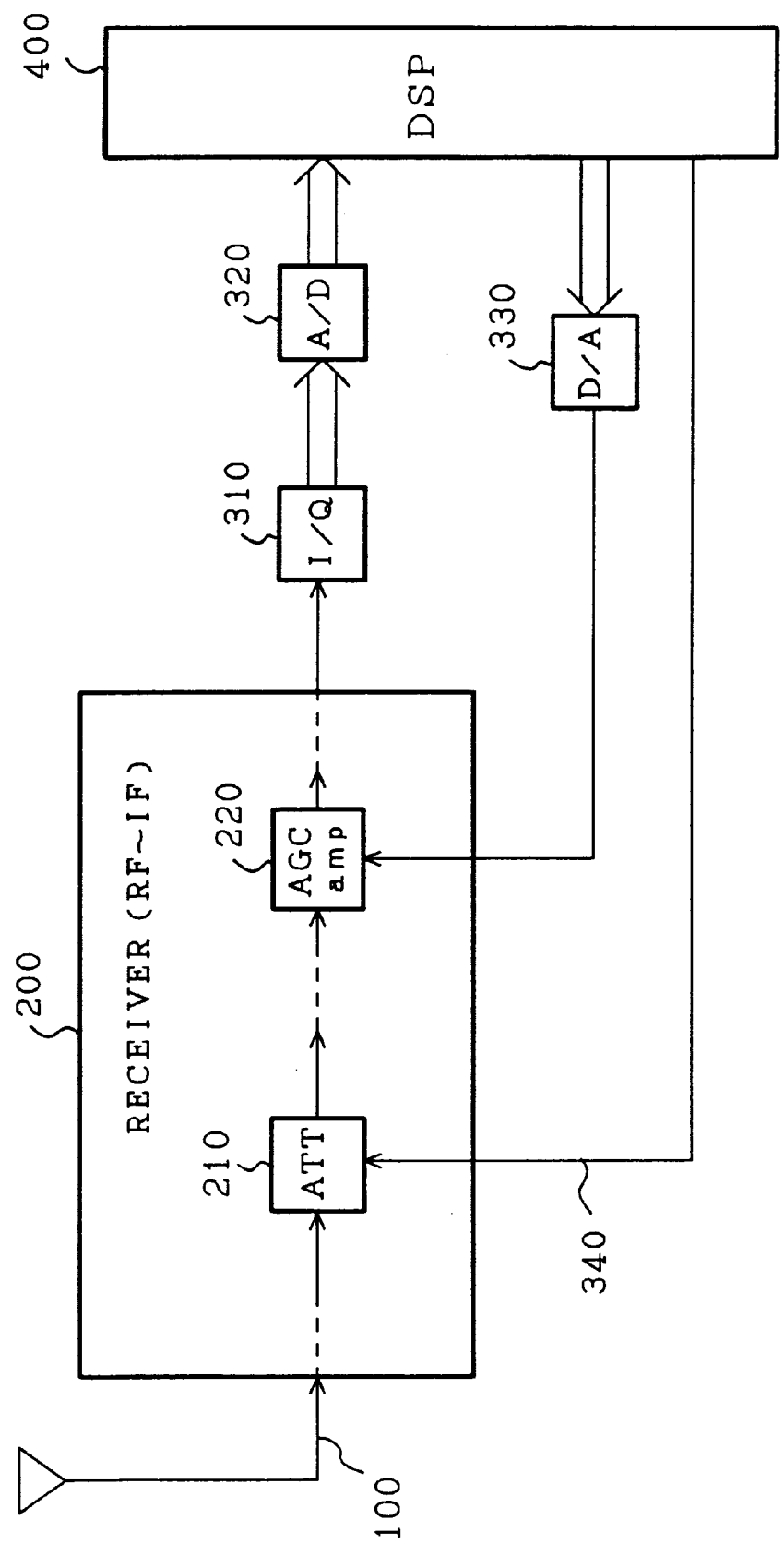
FIG. 10 is a block diagram showing a configuration of a receiver employing an AGC system in the prior art.

A description will now be given of the embodiment 3 with reference to the drawings. FIGS. 8A, 8B and 9 are flowcharts showing an algorithm in an AGC system in a periodic burst signal according to the embodiment 3, which may be realized by any one of circuit configurations of FIGS. 1 to 4.

A description will now be given of the operation.

First, a base station Main CPU initializes a synchronous word detected/undetected counter and an interference wave receive counter (Step 800). A digital signal processor 400 receives a receive timing flag. Further, the digital signal processor 400 starts to receive while applying to a currently received burst signal control values for a variable attenuator and an AGC amplifier derived depending upon a previously received burst signal (Step 801).

Next, in the digital signal processor 400, it is decided whether or not a synchronous word is undetected (Step 802).

If the synchronous word is detected, the base station main CPU is informed of synchronous word detected information (Step 803).

Further, a calculation is made to find a moving average of control errors with respect to the current receive burst signal and receive burst signals in an assigned slot in a current frame to a frame N times before.

The calculated moving average is stored as a control value of a gain control device with respect to a receive burst signal in the same slot in the next frame (Step 804), thereafter waiting a receive start timing flag. In this case, the control value to be set at one time does not exceed an upper limit and a lower limit of a control error monitor range which serve as thresholds.

The control error calculated for each reception of the burst signal may be any one of a control error derived depending upon a synchronous word portion in the burst signal, and a control error derived from a portion other than the synchronous word.

Further, in the two control errors, with consideration given to positive and negative receive timing shifts, the number of symbols corresponding to the timing shift may be removed from the derivation of the control error. This can prevent a malfunction even when the receive timing shift is generated.

When the synchronous word is undetected, the DSP 400 informs the base station Main CPU 500 of information showing that the synchronous word is undetected (Step 805). Subsequently, it is decided whether or not the control error derived from the portion other than the synchronous word is equal to or more than a predetermined value of, for example, −Z dB (Step 806).

If the control error derived from the portion other than the synchronous word is less than −Z dB, it is decided that the control error is insignificant because of BOX processing made in a mobile station. Then, a control value for a gain control device used for the burst signal in the same slot in the next frame is held at the control value used for the receive burst signal in the same slot in the current frame (Step 807).

The "BOX processing" as used herein means processing made for a reduction in transmitting power while no voice is inputted at the mobile station.

The above control can prevent a malfunction since the gain control device is not set depending upon a receive level at a time of low transmitting power of the mobile station as in the case of the BOX processing.

When the control error derived from the portion other than the synchronous word is equal to−Z dB or more, it is decided that an interference wave is received. The base station Main CPU 500 is informed of interference wave received information (Step 808).

Further, a control value of a gain control device used for the same slot in the next frame is held at the control value used for the receive burst signal in the same slot in the current frame (Step 809). The above control can prevent a malfunction since the gain control device is not set depending upon a receive level at a time of low transmitting power of the mobile station as in the case of reception of the interference wave.

The base station Main CPU 500 makes an increment (update) decision of the interference wave receive counter (Step 810), thereafter waiting the next interference receive report when not incremented (Step 811).

On the other hand, when the interference wave receive counter is incremented, an interference wave receive rate is derived by an expression: the number of times the interference wave is received/the number of times a burst is measured (the number of times the synchronous word is detected +the number of times undetected) (Step 812), thereby deciding whether or not the interference wave receive rate exceeds an optional percentage X (Step 813). When not exceeding the percentage X, the base station Main CPU waits the next interference wave receive report (Step 814). When exceeding the percentage X, the base station Main CPU uses the interference wave receive rate together with the communication quality measurement result to make a decision of a request to perform hand off in a cell controlled by a host base station controller (Step 815).

As set forth above, the gain control method according to the present invention is used for the receiver including the attenuating means for attenuating the input signal depending upon each of the first set value and the second set value, the amplifying means for amplifying the input signal depending upon the control signal, and the control means for generating the first set value, the second set value, and the control signal. The gain control method includes the decision step of deciding whether the receive level of the input signal falls in the first control error range corresponding to the first set value or the second control error range corresponding to the second set value, and the gain control step of controlling the gain by attenuating the input signal in the attenuating means depending upon the first set value when it is decided in the decision step that the receive level falls in the first control error range and depending upon the second set value when it is decided that the receive level falls in the second control error range, and amplifying the input signal in the amplifying means. It is decided whether or not the receive level falls in the control error by using the set value for the attenuating means, resulting in an effect in that the gain can be converged in the early stages.

In particular, when the receive level of the input signal falls. in neither the first control error range nor the second control error range in the decision step, the decision is made again after the elapse of the predetermined time period. It is thereby possible to prevent the malfunction since, in particular, the operation is made to compensate for the receive timing shift when the receive timing is shifted.

Further, the gain control method according to the present invention is used for the receiver including the attenuating means for attenuating the input signal depending upon each of the first set value and the second set value, the amplifying means for amplifying the input signal by at least the low gain or the high gain depending upon the control signal, and the control means for generating the first set value, the second set value, and the control signal. The gain control method includes the decision step of deciding whether the receive level of the input signal falls in the first control error range corresponding to the first set value or the second control error range corresponding to the second set value, and the gain control step of controlling the gain by controlling the gain for the input signal depending upon the first set value when it is decided in the decision step that the receive level of the input signal falls in the first control error range and depending upon the second set value when it is decided that the receive level falls in the second control error range, and controlling the amplifying means to the high gain when the receive level of the input signal falls in neither the first control error range nor the second control error range. It is thereby possible to converge the gain in the early stages.

In particular, the first set value for the attenuating means serves as the set value to turn ON the attenuating means, and the second set value serves as the set value to turn OFF the attenuating means, thereby facilitating the control.

Further, the gain control method according to the present invention is used for the receiver including the first attenuating means for attenuating the input signal depending upon each of the first set value and the second set value, the second attenuating means for attenuating the input signal depending upon each of the third set value and the fourth set value, the first amplifying means for amplifying the output signal from the first attenuating means depending upon the first control signal, the second amplifying means for amplifying the output signal from the second attenuating means depending upon the second control signal with higher gain than that of the first amplifying means, and the control means for generating the first, second, third, and fourth set values, and the first and second control signals. The gain control method includes the decision step of deciding in which of the first control error range corresponding to the first set value, the second control error range corresponding to the second set value, the third control error range corresponding to the third set value, and the fourth control error range corresponding to the fourth set value the receive level of the input signal falls, and the gain control step of controlling the gain by attenuating and amplifying the input signal depending upon the set value and the amplifying means corresponding to the control error range in which the receive level of the input signal falls. It is thereby possible to converge the gain in the early stages, and extend the gain control range (dynamic range).

In particular, when the receive level of the input signal does not fall in any one of the first control error range, the second control error range, the third control error range, and the fourth control error range in the decision step, the decision is made again after the elapse of the predetermined time period. It is thereby possible to prevent the malfunction since, in particular, the operation is made to compensate for the receive timing shift when the receive timing is shifted.

After the gain control step, the second control signal is added to the first amplifying means, and the first control signal is added to the second amplifying means, thereby performing the decision step and the gain control step. As a result, the malfunction can be prevented. The respective control error ranges are set to overlap each other by the predetermined range so that the variation in receive level with no correlation can be absorbed. The method further includes the evaluation step of evaluating the communication state depending upon the received synchronous word after the gain control in the gain control step. It is thereby possible to detect the fault and control the communication quality in the receiver. The method further includes the evaluation step of evaluating the communication state depending upon the received synchronous word after the gain control in the gain control step, and the reception limitation step of, when an abnormality of the communication state is detected in the evaluation step, limiting the reception by the attenuating means and the amplifying means on the side on which the abnormality is detected. It is thereby possible to prevent the malfunction when the failure occurs in any one of the receive systems. Further, the receiver according to the present invention includes the attenuating means for attenuating the input signal depending upon each of the first set value and the second set value, the amplifying means for amplifying the input signal depending upon the control signal, and the control means for generating the first set value, the second set value, and the control signal. The control means includes the deciding means for deciding whether the receive level of the input signal falls in the first control error range corresponding to the first set value or the second control error range corresponding to the second set value, and the gain control means for controlling the gain by attenuating the input signal in the attenuating means depending upon the first set value when it is decided in the deciding means that the receive level falls in the first control error range and depending upon the second set value when it is decided that the receive level falls in the second control error range, and amplifying the input signal in the amplifying means. It is thereby possible to converge the gain in the early stages.

Further, the receiver according to the present invention includes the attenuating means for attenuating the input signal depending upon the set value, the amplifying means for amplifying the input signal depending upon the control signal, and the control means for generating the set value, and the control signal. The control means generates the set value and the control signal depending upon the average of the values of the plurality of past control errors. It is thereby possible to accurately generate the set value and the control signal.

In particular, when the synchronous word contained in the input signal is undetected, and the control error derived from the portion other than the synchronous word is equal to or less than the predetermined value, the control means decides that this is caused by the silence processing on the transmitting side, and the control error is excluded from the plurality of past control errors used to find the average. It is thereby possible to prevent the malfunction in case of the silence processing on the transmitting side.

Further, when the synchronous word contained in the input signal is undetected, and the control error derived from the portion other than the synchronous word is equal to or more than the predetermined value, the control means decides that this is caused by the interference wave to the input signal, and the control error is excluded from the plurality of past control errors used to find the average. It is thereby possible to prevent the malfunction due to the interference wave.

INDUSTRIAL APPLICABILITY

As set forth above, a gain control method and a receiver according to the present invention are suitable for the use in a radio base station communicating with, for example, a plurality of mobile stations.

What is claimed is:

1. A gain control method used for controlling the gain of a receiver including an attenuator for attenuating an input signal depending upon each of a first set value and a second set value, an amplifier for amplifying said input signal depending upon a control signal, and a controller for generating the first set value, the second set value, and the control signal, said gain control method comprising the steps of:

separately attenuating said input signal using said first set value to obtain a first attenuated input signal, and using said second set value to obtain a second attenuated input signal, and determining a control error of each of said first and second attenuated input signals;

deciding whether a receive level of said input signal falls in a first control error range corresponding to the first set value or a second control error range corresponding to the second set value by comparing the control error of the first attenuated input signal with said first control error range, and comparing the control error of the second attenuated input signal with said second control error range; and thereafter controlling the gain by attenuating an input signal in the attenuator using the first set value when it is decided in the decision step that the receive level falls in the first control error range and using the second set value when it is decided that the receive level falls in the second control error range, and amplifying an input signal in the amplifier.

2. A gain control method according to claim 1, wherein, when the receive level of the input signal falls in neither the first control error range nor the second control error range in the decision step, the decision step is performed again after the elapse of a predetermined time period.

3. A gain control method used for controlling the gain of a receiver including an attenuator for attenuating an input signal depending upon each of a first set value and a second set value, an amplifier for amplifying said input signal by at least a low gain or a high gain depending upon a control signal, and a controller for generating the first set value, the second set value, and the control signal, the gain control method comprising the steps of:

with said amplifier set to a low gain, separately attenuating said input signal using said first set value to obtain a first attenuated input signal, and using said second set value to obtain a second attenuated input signal, and determining a control error of each of said first and second attenuated input signals;

deciding whether a receive level of said input signal falls in a first control error range corresponding to the first set value or a second control error range corresponding to the second set value by comparing the control error of the first attenuated input signal with said first control error range, and comparing the control error of the second attenuated input signal with said second control error range; and thereafter controlling the gain of said receiver by attenuating an input signal in the attenuator using the first set value when it is decided in the decision step that the receive level of the input signal falls in the first control error range and using the second set value when it is decided that the receive level falls in the second control error range, and setting the amplifier to a high gain when the receive level of the input signal falls in neither the first control error range nor the second control error range.

4. A gain control method according to claim 1 wherein the first set value for the attenuator means serves as a set value to turn ON the attenuator means, and the second set value serves as a set value to turn OFF the attenuator means.

5. A gain control method according to claim 1, wherein the attenuator means includes amplifying means selected corresponding to the first set value, and attenuator means selected corresponding to the second set value.

6. A gain control method used for controlling the gain of a receiver including a first attenuator for attenuating an input signal depending upon each of a first set value and a second set value, a second attenuator for attenuating an input signal depending upon each of a third set value and a fourth set value, a first amplifier for amplifying an output signal from the first attenuator depending upon a first control signal, a second amplifier for amplifying an output signal from the second attenuator depending upon a second control signal with a higher gain than that of the first amplifier, and a controller for generating the first, second, third, and fourth set values, and the first and second control signals, the gain control method comprising the step of:

deciding in which of a first control error range corresponding to the first set value, a second control error range corresponding to the second set value, a third control error range corresponding to the third set value, and a fourth control error range corresponding to the fourth set value a receive level of an input signal falls; and controlling the gain of said receiver by attenuating and amplifying an input signal depending upon the set value and the amplifier corresponding to the control error range in which the receive level of the input signal falls.

7. A gain control method according to claim 6, wherein, when the receive level of the input signal does not fall in any one of the first control error range, the second control error range, the third control error range, and the fourth control error range in the decision step, the decision is made again after the elapse of a predetermined time period.

8. A gain control method according to claim 6, wherein, after the gain control step, the second control signal is added to the first amplifier means, and the first control signal being added to the second amplifier, thereby performing the decision step and the gain control step.

9. A gain control method according to claim 1, wherein the respective control error ranges are set to overlap each other by a predetermined range.

10. A gain control method according to claim 1, further comprising the evaluation step of evaluating a communication state depending upon a received synchronous word after a gain control in the gain control step.

11. A gain control method according to claim 6, further comprising the steps of:

evaluating a communication state depending upon a received synchronous word represented by said input signal after a gain control in the gain control step; and when an abnormality of a communication state is detected in the evaluation step, limiting reception by the attenuator and the amplifier being used, in which the abnormality is detected.

12. A receiver comprising:

an attenuator for separately attenuating an input signal using each of a first set value and a second set value, to obtain a first attenuated input signal and a second attenuated input signal;

an amplifier for amplifying said input signal depending upon a control signal; and a controller for generating the first set value, the second set value, and the control signal, wherein the controller includes deciding means for deciding whether a receive level of an input signal falls in a first control error range corresponding to the first set value or a second control error range corresponding to the second set value, by obtaining a control error of each of said first and second attenuated input signals and comparing the control errors with said first and second control error range, respectively, and gain control means for controlling the gain by attenuating an input signal in the attenuator using the first set value when it is decided in the deciding means that the receive level falls in the first control error range and using the second set value when it is decided that the receive level falls in the second control error range, and amplifying an input signal in the amplifier.

13. A receiver according to claim 12, wherein the controller generates the set value and the control signal depending upon an average of values of a plurality of past control errors.

14. A receiver according to claim 13, wherein, when a synchronous word contained in an input signal is undetected, and a control error derived from a portion other than a synchronous word is equal to or less than a predetermined value, the controller decides that this is caused by silence processing on the transmitting side, and the control error being excluded from a plurality of past control errors used to find the average.

15. A receiver according to claim 13, wherein, when a synchronous word contained in an input signal is undetected, and a control error derived from a portion other than a synchronous word is equal to or more than a predetermined value, the controller decides that this is caused by an interference wave to the input signal, and the control error being excluded from a plurality of past control errors used to find the average.

16. A gain control method according to claim 3, wherein the first set value for the attenuator serves as a set value to turn ON the attenuator, and the second set value serves as a set value to turn OFF the attenuator.

17. A gain control method according to claim 3, wherein the attenuator includes amplifying means selected corresponding to the first set value, and attenuator selected corresponding to the second set value.

18. A gain control method according to claim 3, wherein the respective control error ranges are set to overlap each other by a predetermined range.

19. A gain control method according to claim 6, wherein the respective control error ranges are set to overlap each other by a predetermined range.

20. A gain control method according to claim 3, further comprising the evaluation step of evaluating a communication state depending upon a received synchronous word after a gain control in the gain control step.

21. A gain control method according to claim 6, further comprising the evaluation step of evaluating a communication state depending upon a received synchronous word after a gain control in the gain control step.

* * * * *

UNITED STATES PATENT AND TRADEMARK OFFICE
CERTIFICATE OF CORRECTION

PATENT NO.   : 6,167,244
DATED        : December 26, 2000
INVENTOR(S)  : Naohito Tomoe It is certified that error appears in the above-identified patent and that said Letters Patent is hereby corrected as shown below:

Column 14,
Line 30, after "falls" delete the period ".".

Column 17,
Lines 39, 40, 41, 43 and 44 delete "means".

Column 18,
Line 12, delete "means".

Signed and Sealed this

Twenty-seventh Day of May, 2003

JAMES E. ROGAN
*Director of the United States Patent and Trademark Office*